United States Patent [19]

Morris

[11] 4,307,305

[45] Dec. 22, 1981

[54] PRECISION RECTIFIER CIRCUITS

[75] Inventor: Darryl C. Morris, Concord, N.H.

[73] Assignee: Northern Telecom, Inc., Nashville, Tenn.

[21] Appl. No.: 110,474

[22] Filed: Jan. 8, 1980

[51] Int. Cl.³ .................... H03K 5/01; G06G 7/12
[52] U.S. Cl. ............................ 307/261; 307/491; 307/499; 328/6; 363/45
[58] Field of Search .............. 328/26; 363/44, 45; 307/261, 491, 499

[56] References Cited

U.S. PATENT DOCUMENTS 3,553,566  1/1971  Nagy, Jr. ........................... 328/26

OTHER PUBLICATIONS

Electronic Design Notes (EDN), Measure Differential A.C. Signal Easily with Precision Rectifiers, by J. Graeme, Jan. 20, 1975, pp. 45-47.
Electronic Design Notes (EDN), Full Wave Rectifier Needs Only Two Resistors, by S. Smith, Jan. 5, 1975, p. 56.

Primary Examiner—Stanley D. Miller, Jr.
Assistant Examiner—B. P. Davis
Attorney, Agent, or Firm—Spencer & Kaye

[57] ABSTRACT

A precision rectifier circuit includes two differential amplifiers each having a negative feedback path including a diode. Two pnp transistors have their base-emitter paths connected in parallel with the respective diodes and their collectors connected together and via an output resistor to ground. An a.c. signal to be rectified is applied to non-inverting inputs of the amplifiers, whose inverting inputs are interconnected via a resistor in series with a capacitor, to develop a unipolar output voltage across the output resistor. The capacitor renders the output voltage independent of input offset voltages of the amplifiers. The transistors can comprise Darlington-connected transistors to avoid the need for matching.

6 Claims, 4 Drawing Figures

PRECISION RECTIFIER CIRCUITS

This invention relates to precision rectifier circuits.

BACKGROUND OF THE INVENTION

It is frequently required in telephony test equipment to convert accurately an a.c signal to a corresponding d.c. (full-wave rectified) voltage; this conversion is commonly called precision rectification and is achieved using a precision rectifier circuit.

Ideally, a precision rectifier circuit has perfect symmetry, so that it converts equal magnitude but opposite polarity half cycles of the a.c. signal to equal magnitude pulses of the full-wave rectified output voltage. However, known precision rectifier circuits suffer to some extent from non-symmetry, which may be caused by different gains from the input to the output for the respective polarities, or by offset voltages of amplifiers used in the precision rectifier circuit. Non-symmetry arising from the former cause results in a constant percentage error for all levels of the a.c. input signal, and in some cases may be tolerable. Non-symmetry arising from the latter cause results in a percentage error which increases as the level of the a.c input signal is reduced, and which is often the limiting factor in determining the dynamic range of the circuit. The dynamic range is the range of input magnitudes over which the circuit functions within a given accuracy.

The operation of precision rectifier circuits is also affected by other factors such as amplifier output voltage slew rates and the switching, storage, and reverse recovery times of diodes and transistors used in the circuits; in particular these factors limit the highest frequency at which the circuit can be used within a given accuracy.

In order to improve the performance of precision rectifier circuits, resort has been made to the use of closely matched components such as resistors, transistors, and diodes, but this results in an undesired increase in the complexity and cost of the circuits.

BRIEF DESCRIPTION OF DRAWINGS

In the accompanying drawings, in which similar references are used in different figures to denote similar components.

DESCRIPTION OF PRIOR ART

Figure 1:
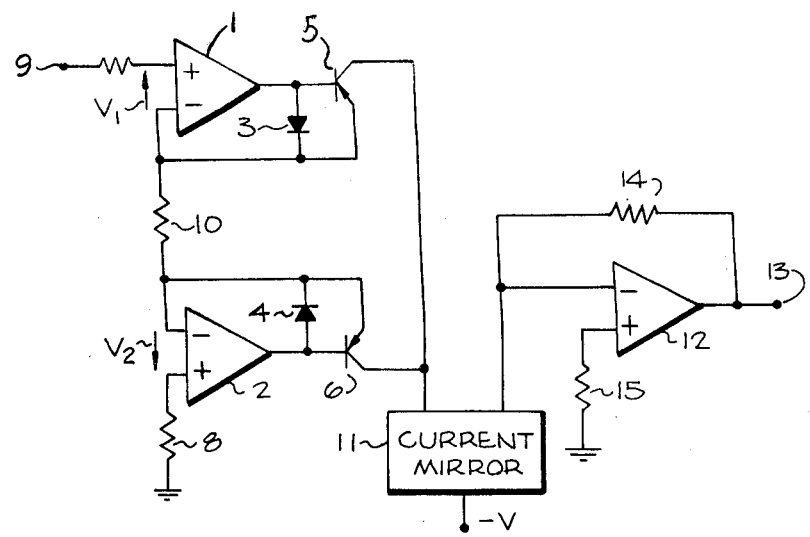
FIGS. 1 and 2 schematically illustrate known precision rectifier circuits.

FIG. 1 illustrates a precision rectifier circuit which is known from EDN (Electronic Design Notes), Jan. 5, 1975, page 56. The circuit comprises two operational amplifiers 1 and 2 each of which has a diode 3 and 4 respectively, and the base-emitter path of a pnp transistor 5 and 6 respectively, connected between its output and its inverting input. The diodes are poled to conduct current from the amplifier outputs to the amplifier inputs, and the transistors are connected so that their base-emitter paths are poled oppositely to the diodes. The non-inverting inputs of the amplifiers 1 and 2 are connected respectively via a resistor 7 to an input terminal 9, and via a resistor 8 to ground. A resistor 10 is connected between the inverting inputs of the amplifiers 1 and 2. The transistors 5 and 6 have their collectors connected together and to a unity-gain current mirror circuit 11 whose output is connected to the inverting input of an operational amplifier 12. The amplifier 12 has its output connected to an output terminal 13 and via a feedback resistor 14 to its inverting input, and has its non-inverting input connected via a resistor 15 to ground.

In operation of the circuit of FIG. 1, when an a.c. input signal applied to the input terminal 9 is positive current flows from the output of amplifier 1 via diode 3, resistor 10, and transistor 6, when the a.c. input signal is negative current flows from the output of amplifier 2 via diode 4, resistor 10, and transistor 5 to the current mirror circuit 11. Thus current flow from the transistors 5 and 6 into the current mirror circuit 11 is unipolar. An equal current at the output of the circuit 11 is converted by the amplifier 12 to an output voltage at the output terminal 13, which output voltage is a full-wave rectified version of the a.c. input signal. In fact it can be shown that, if the a.c. input voltage is Ein, the resistor 10 has a resistance R1, and the resistor 14 has a resistance R2, then the output voltage Eout = |Ein|.R2/R1.

In the known circuit of FIG. 1, the transistors 5 and 6 are matched to reduce non-symmetry due to different gains for the two polarities of the a.c. input signal. The transistors 5 and 6 are also matched to three transistors (not shown) which constitute the current mirror circuit 11. Non-symmetry still arises, however, from the input offset voltages V1 and V2 of the amplifiers 1 and 2 respectively, unless these offset voltages are exactly equal. Any inequality of these offset voltages gives rise to a direct voltage component which is effectively connected in series with the alternating input signal voltage and thus gives rise to an error in the output voltage Eout, which error is particularly significant at low levels of the input a.c. signal.

In order to compensate for this error due to offset voltages, the prior art teaches firstly minimizing the error by decreasing a set current which is supplied to the amplifiers 1 and 2, and then nulling the error by supplying a compensating current to the inverting input of the amplifier 12. However, this procedure involves the disadvantages of reducing the output current capability of the amplifiers 1 and 2 and requiring additional circuitry and adjustment thereof to provide the desired compensating current.

Figure 2:
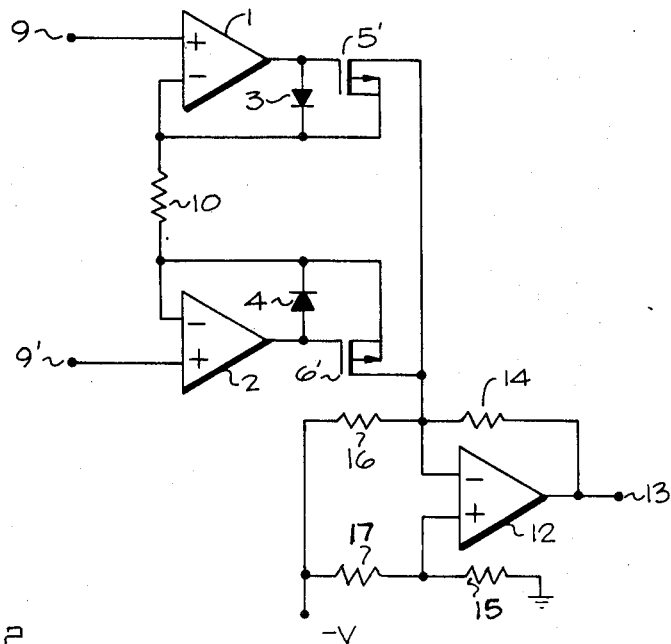

FIG. 2 illustrates another precision rectifier circuit which is known from EDN, Jan. 20, 1975, pages 47 and 48. This circuit is similar to that of FIG. 1, except that a differential input is provided via input terminals 9 and 9' to the non-inverting inputs of the amplifiers 1 and 2, the pnp transistors 5 and 6 of FIG. 1 are replaced by MOS field-effect transistors 5' and 6' respectively, and the current mirror circuit 11 of FIG. 1 is replaced by resistors 16 and 17 in FIG. 2. The operation of FIG. 2 is similar to that of FIG. 1. The transistors 5' and 6' are matched, and the resistors 10 and 14 to 17 are also matched.

The circuit of FIG. 2 suffers from the same disadvantage as that of FIG. 1, namely that the input offset voltages of the amplifiers 1 and 2 give rise to an error in the output voltage. This prior art teaches reducing the error by the use of operational amplifier offset controls, again involving the disadvantage of requiring additional circuitry and adjustment thereof. Further, the circuit of FIG. 2 requires a relatively large number of closely matched components.

SUMMARY OF THE INVENTION

An object of the invention is to provide a precision rectifier circuit in which the output is not subject to error due to input offset voltages of amplifiers used in the circuit, and in which offset nulling circuitry and adjustment thereof are dispensed with, without requiring the use of amplifiers which are closely matched or are selected to have particularly small input offset voltages.

According to this invention there is provided a precision rectifier circuit comprising:

two differential amplifiers each having an inverting input, a non-inverting input, and an output;

means for applying an a.c. input signal to be rectified to said non-inverting inputs;

a resistance and a capacitance connected in series between said inverting inputs;

two diodes each connected in a feedback path from, and poled to conduct current from, the output to the inverting input of an associated one of the amplifiers;

two transistors, each having a controlled path connected between a junction point and the inverting input of an associated one of the amplifiers and a control path connected in parallel with the associated diode, each transistor being arranged to conduct current via its controlled path when the associated diode is reverse biased; and means connected to said junction point for producing a unipolar output voltage dependent upon the currents conducted via the controlled paths of said transistors.

Thus in accordance with this invention a capacitance is connected in series with the resistance provided between the inverting inputs of the amplifiers. This capacitance, which can be constituted by two polarised capacitors connected in series with opposite polarity, blocks d.c., so that only a.c. voltages arising from the a.c. input signal appear across the resistance and hence contribute to the output voltage. Consequently, the output voltage is rendered independent of different input offset voltages of the amplifiers.

The means connected to the junction point can comprise a resistor connected between the junction point and a point of reference potential such as ground. In order to avoid any need for precise-value resistors to determine the gain of the circuit, the junction point can be connected to the input of a following adjustable-gain buffer amplifier stage.

The transistors can be bipolar pnp transistors or MOS field-effect transistors. In a preferred embodiment, each feedback path includes two series-connected diodes poled to conduct current from the output to the inverting input of the associated amplifier, and each of said two transistors is constituted by two Darlington-connected bipolar pnp transistors having their base-emitter paths connected in parallel with the associated series-connected diodes and their collectors connected to said junction point. The Darlington-connected transistors provide a high gain which avoids the need for the transistors to be closely matched.

DETAILED DESCRIPTION OF PREFERRED EMBODIMENTS

Figure 3:
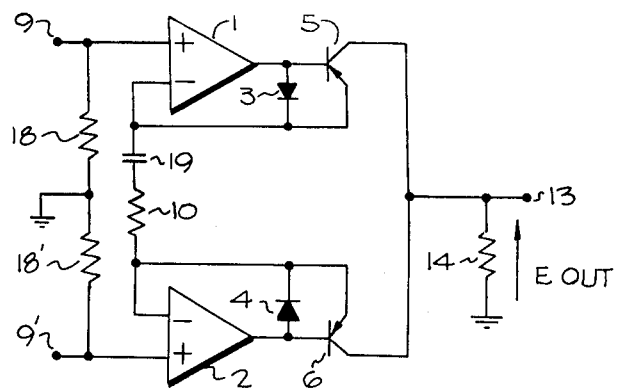
FIGS. 3 and 4 schematically illustrate precision rectifier circuits according to this invention.

FIG. 3 schematically illustrates a first embodiment of the invention, in which differential input terminals 9 and 9′ are connected to the non-inverting inputs of amplifiers 1 and 2, and also to ground via resistors 18 and 18′ respectively. The amplifiers 1 and 2 are low input current bifet operational amplifiers, but need not be closely matched nor need they have particularly small input offset voltages. The amplifiers 1 and 2, and also diodes 3 and 4 and pnp transistors 5 and 6, are connected in the same manner as in FIG. 1, except that in FIG. 3 the collectors of the transistors 5 and 6 are connected directly to the output terminal 13 and via the resistor 14 to ground. In contrast to the circuit of FIG. 1, the inverting inputs of the amplifiers 1 and 2 in FIG. 3 are connected together via the resistor 10 and via a capacitor 19 connected in series with the resistor 10.

The operation of the circuit of FIG. 3 is substantially the same as that of the circuit of FIG. 1, as far as a.c. input signals are concerned, and accordingly need not be described again. As in the circuit of FIG. 1, in the circuit of FIG. 3 for an a.c. input voltage Ein, and resistances R1 and R2 of the resistors 10 and 14 respectively, the output voltage Eout = |Ein|.R2/R1. However, in the circuit of FIG. 3 this output voltage Eout is not subject to error arising from the input offset voltages of the amplifiers 1 and 2, due to the provision of the capacitor 19 in series with the resistor 10. This situation arises because any difference between the input offset voltages of the amplifiers 1 and 2, instead of being effectively connected in series with the alternating input signal voltage as in the circuits of FIGS. 1 and 2, is dropped across the capacitor 19. The capacitor 19 transmits to the resistor 10 only alternating currents which arise from the alternating input signal which is applied to the input terminals 9, 9′.

Thus in the circuit of FIG. 3, by the apparently simple provision of the capacitor 19′ in series with the resistor 10, the effect of input offset voltage differences of the amplifiers 1 and 2 on the output voltage Eout is eliminated. Consequently there is no need to provide the adjustable offset compensation circuitry of the prior art, and there is no need for close matching of the amplifiers 1 and 2.

Figure 4:
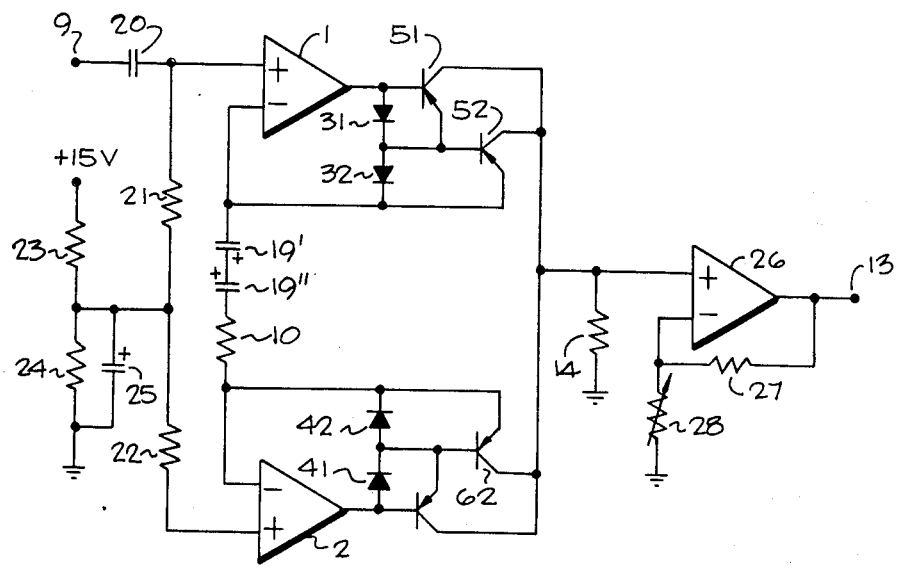

FIG. 4 schematically illustrates a second, more preferred, embodiment of the invention, in which each of the diodes 3 and 4 of FIG. 3 is replaced by two series-connected diodes 31, 32 and 41, 42 respectively, and each of the pnp transistors 5 and 6 of FIG. 3 is replaced by two Darlington-connected pnp transistors 51, 52 and 61, 62 respectively, the emitter-base junctions of the Darlington-connected transistors being connected to the junctions between the respective series-connected diodes. This arrangement provides high gain and consequently a reduced current which flows between the base of the transistors 51 or 61 and the output of the amplifier 1 or 2 respectively. This base current constitutes an error in the precision rectification process, and its reduction reduces this error and avoids the need for the transistors to be closely matched.

The circuit of FIG. 4 differs from that of FIG. 3 in other, more minor, respects, although its operation is substantially the same and accordingly its description need not be repeated. In FIG. 4 the a.c. input signal is applied via a single input terminal 9 and via a d.c. blocking capacitor 20 to the non-inverting input of the amplifier 1. The non-inverting inputs of the amplifiers 1 and 2 are in this case connected via resistors 21 and 22 respectively to a junction point of a potential divider formed by resistors 23 and 24, which junction point is grounded for a.c. signals by a capacitor 25. In addition, the single capacitor 19 of FIG. 3 is replaced by two oppositely poled capacitors 19′ and 19″ in FIG. 4. These capacitors serve the same purpose as the capacitor 19 in FIG. 3.

It should be appreciated from the above description that the circuit of FIG. 4, as so far described, constitutes a precision recitifer circuit which is accurate and provides symmetrical rectification, but does not require the use of closely matched components or adjustable components. The only components which are critical are the resistors 10 and 14, whose resistance ratio R2/R1 determines the overall gain of the circuit. In order to avoid the need for these components to be particularly precise, the circuit of FIG. 4 also includes an output buffer amplifier stage comprising a differential amplifier 26, a negative feedback resistor 27, and an adjustable resistor 28 connected between the amplifier's inverting input and ground. The adjustable resistor 28 provides a gain adjustment for the buffer amplifier, and hence for the overall precision rectifier circuit arrangement.

It is observed by way of further illustration that, in a precision rectifier circuit constructed in accordance with FIG. 4, the amplifiers 1, 2, and 26 were type TL082; the diodes 31, 32, 41, and 42 were type 1N4148; the transistors 51, 52, 61, and 62 were type 2N5087; the resistors 10, 14, and 21 to 24 were 10kΩ, 1% tolerance; the resistor 27 was 3.0kΩ; the resistor 28 was formed by a 500Ω fixed resistor in series with a 1kΩ variable resistor; and the capacitors 20 and 25 were respectively 10μF and 68μF tantalum capacitors. The constructed circuit provided rectification of a.c. input signals at frequencies up to 4kHz with an error within about 0.01dB measured at −20dB from the maximum of the circuit's dynamic range.

Numerous modifications, variations, and adaptations may be made to the embodiments of the invention described above without departing from the scope of the invention as defined in the claims. In particular, it is observed that the particular input and output circuit arrangements illustrated in FIGS. 1 and 2, and other input and output circuit configurations, may be incorporated in the precision rectifier circuits of FIGS. 3 and 4. Furthermore, field-effect transistor arrangements such as that illustrated in FIG. 2 may be used to replace the bipolar transistor arrangements illustrated in FIGS. 3 and 4.

What is claimed is:

1. A precision rectifier circuit comprising:

two differential amplifiers each having an inverting input, a non-inverting input, and an output;

means for applying an a.c. input signal to be rectified to said non-inverting inputs;

a resistance and a capacitance connected in series between said inverting inputs;

two diodes, each connected in a feedback path from, and poled to conduct current from, the output to the inverting input of an associated one of the amplifiers;

two transistors, each having a controlled path connected between a junction point and the inverting input of an associated one of the amplifiers and a control path connected in parallel with the associated diode, each transistor being arranged to conduct current via its controlled path when the associated diode is reverse biased; and means connected to said junction point for producing a unipolar output voltage dependent upon the currents conducted via the controlled paths of said transistors.

2. A precision rectifier circuit as claimed in claim 1 wherein said means connected to said junction point comprises a resistor connected between said junction point and a point of reference potential, said unipolar output voltage being produced across said resistor.

3. A precision rectifier circuit as claimed in claim 2 and including an adjustable-gain buffer amplifier stage having an input connected to said junction point.

4. A precision rectifier circuit as claimed in claim 1, 2, or 3 wherein said capacitance comprises two polarised capacitors connected in series with opposite polarity.

5. A precision rectifier circuit as claimed in claim 1, 2, or 3 wherein each of said transistors is a bipolar pnp transistor having its base and emitter connected respectively to the output and inverting input of the associated amplifier, and having its collector connected to said junction point.

6. A precision rectifier circuit as claimed in claim 1, 2, or 3 wherein each feedback path includes two series-connected diodes poled to conduct current from the output to the inverting input of the associated amplifier, and each of said two transistors is constituted by two Darlington-connected bipolar pnp transistors having their base-emitter paths connected in parallel with the associated series-connected diodes and their collectors connected to said junction point.

* * * * *